United States Patent [19]

Nishioka et al.

[11] Patent Number: 4,891,684
[45] Date of Patent: Jan. 2, 1990

[54] SEMICONDUCTOR DEVICE

[75] Inventors: Yasushiro Nishioka, New Haven, Conn.; Hiroshi Shinriki; Noriyuki Sakuma, Tokyo; Kiichiro Mukai, Tokyo, Japan

[73] Assignee: Hitachi, Ltd., Tokyo, Japan

[21] Appl. No.: 81,231

[22] Filed: Aug. 4, 1987

[30] Foreign Application Priority Data

Aug. 4, 1986 [JP] Japan ................... 61-181916

[51] Int. Cl.⁴ .................. H01L 27/02; H01L 29/78; H01L 29/34
[52] U.S. Cl. ........................... 357/51; 357/54; 357/23.6; 437/919
[58] Field of Search ............ 357/51, 54, 23.6, 14; 437/919

[56] References Cited

U.S. PATENT DOCUMENTS

| 4,038,167 | 7/1977 | Young ................. 437/919 |
| 4,495,219 | 1/1985 | Kato et al. ............ 437/919 |
| 4,603,059 | 7/1986 | Kiyosumi et al. ...... 437/919 |
| 4,621,277 | 11/1986 | Ito et al. .............. 357/52 |

FOREIGN PATENT DOCUMENTS 59-11663  1/1984  Japan ................... 437/919

Primary Examiner—Rolf Hille
Assistant Examiner—Robert P. Limanek
Attorney, Agent, or Firm—Antonelli, Terry & Wands

[57] ABSTRACT

A reaction-preventing film is provided between a capacitor insulating film made of a material having a high dielectric constant, such as $Ta_2O_5$, and an upper electrode in order to prevent a reaction of the upper electrode with the capacitor insulating film. This effectively prevents the reaction between the upper electrode and the capacitor caused by a heat treatment conducted after formation of the capacitor, and hence prevents an increase in leakage current caused by the reaction. Thus, the reliability of a semiconductor device is remarkably increased.

39 Claims, 1 Drawing Sheet

SEMICONDUCTOR DEVICE

BACKGROUND OF THE INVENTION

The present invention relates to a semiconductor device, and particularly to a semiconductor device having a capacitor of a large capacity and a high reliability which uses a high dielectric constant insulating film as the capacitor insulating film.

With an increasing integration density of an LSI (large scale integrated circuit), miniaturization of a capacitor as the constituent of the LSI has been increasingly demanded. Thus, it was attempted to use a tantalum oxide ($Ta_2O_5$) having a relative permittivity of 22, which is more than 6 times as high as that of silicon dioxide ($SiO_2$) used as a conventional capacitor insulating film, for the purpose of increasing the capacitance of the capacitor, whereby the size of a semiconductor device is reduced, as described in, for example, Japanese Pat. Laid-Open Nos. 61,634/1983 and 4,152/1984.

However, part of the above-mentioned $Ta_2O_5$ is chemically reacted with an element contained in an upper electrode, for example, silicon (Si), during a heat treatment conducted in the course of MOSLSI production after formation of a capacitor to give Ta, whereby the dielectric strength of the capacitor is lowered. This reaction is expressed by the following formula (1):

$$2Ta_2O_5 + 5Si \rightarrow 4Ta + 5SiO_2 \quad (1)$$

A polycrystalline Si film, which is most chemically stable during the course of production of a semiconductor device, is most widely used as the upper electrode of a capacitor. However, when a high dielectric constant insulating film such as the above-mentioned $Ta_2O_5$ film, which is suitable for increasing the integration density of a semiconductor device, is used as a capacitor insulating film, Si of the polycrystalline Si film is diffused into the $Ta_2O_5$ film and reacted with the $Ta_2O_5$ film by the heat treatment in the course of production of the semiconductor device.

Accordingly, in the above-mentioned prior art technique, a high melting point metal or compounds thereof, such as a silicide, having a concentration of Si lower than the stoichiometric one must be used in the upper electrode in order to prevent the reaction of Si in the upper electrode with the $Ta_2O_5$ film. However, the above-mentioned high-melting point metal or compounds thereof having a low Si concentration is so chemically unstable that it is readily oxidized by a heat treatment in the course of production or readily corroded by a chemical such as an etching solution.

Thus, a high dielectric constant insulating film is difficult to use in MOSLSI according to the prior art technique.

U.S. Pat. No. 4,151,607 discloses that the use of a $Si_3N_4$ film or a $Ta_2O_5$ film instead of a $SiO_2$ film as the insulating film of a capacitor is effective in decreasing the required area. However, there is no description as to an increase in leakage current caused by the reaction of $Ta_2O_5$ with silicon.

SUMMARY OF THE INVENTION

An object of the present invention is to provide a semiconductor device wherein the reaction of a high dielectric constant insulating film such as $Ta_2O_5$ with an upper electrode containing Si is prevented to enable the high dielectric constant insulating film to be used as a capacitor insulating film, whereby the increase in the integration density of a semiconductor device can be achieved.

In order to attain the above-mentioned object according to the present invention, a thin $SiO_2$ film or a thin silicon nitride ($Si_3N_4$) is disposed as a reaction-preventing film between a high dielectric constant insulating film formed on a silicon substrate or a lower electrode containing silicon and an upper electrode consisting of Si or containing Si which is made of polycrystalline Si, a high melting point metal or its silicide, thereby preventing the reaction of an element such as Si contained in the upper electrode with the high dielectric constant insulating film due to a heat treatment in the course of production of a semiconductor device after formation of a capacitor.

The thickness of the above-mentioned reaction-preventing film is desirably about 10 to 100Å, preferably 20 to 100Å. When the thickness of the film is too small, Si or the like contained in the upper electrode readily passes through the film and enters the above-mentioned high dielectric constant insulating film. Thus, the reaction-preventing film cannot serve as such. On the other hand, when the thickness of the reaction-preventing film is too large, the capacity of the capacitor is decreased.

Where the reaction-preventing film is a $Si_3N_4$ film, oxidation of the $Si_3N_4$ film after formation thereof extremely decreases the initial dielectric breakdown to provide a further excellent capacitor. Where the reaction-preventing film is a $SiO_2$ film, nitriding of the $SiO_2$ film after formation thereof provides the same effect.

Provision of the reaction-preventing film such as the $SiO_2$ film or the $Si_3N_4$ film as a barrier layer between the high dielectric constant insulating film and the upper electrode can prevent diffusion of an element contained in the upper electrode, such as Si, into the high dielectric constant insulating film from the upper electrode due to a heat treatment in the course of production of a semiconductor device after formation of the capacitor to thereby prevent the reaction of the above-mentioned element with the high dielectric constant insulating film. Accordingly, the high dielectric constant insulating film such as a $Ta_2O_5$ film can be used as the capacitor insulating film without causing any lowering in the dielectric strength of the capacitor, whereby a capacitor having a high capacity and a high reliability can be realized, which is very effective in increasing the integration density of the LSI.

DETAILED DESCRIPTION OF THE PREFERRED EMBODIMENTS

Figure 1:
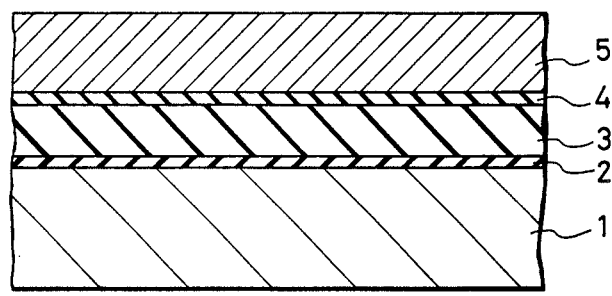
FIG. 1 is a cross-sectional view of an essential part of an example of the present invention and FIG. 2 is a graph showing an instance of the effects of the present invention.

FIG. 1 is a schematic cross-sectional view of a semiconductor device having a capacitor as an example of the present invention.

In this figure, numeral 1 referred to a Si substrate, numeral 2 to a $SiO_2$ film formed as a native oxide layer and having a thickness of about 20Å, numeral 3 to a $Ta_2O_5$ film formed as a capacitor insulating film on the $SiO_2$ film 2 and having a high dielectric constant and a thickness of about 200Å, numeral 4 to a $Si_3N_4$ film formed as a reaction-preventing film on the $Ta_2O_5$ film 3 and having a thickness of about 30Å, and numeral 5 to a polycrystalline Si film formed as an upper electrode on the $Si_3N_4$ film 4.

A semiconductor device as shown in FIG. 1 was formed according to the following procedure. A $Ta_2O_5$ film 3 was formed as a capacitor insulating film on a Si substrate 1 according to the well-known CVD method (chemical vapor deposition method). When the $Ta_2O_5$ 3 was formed, a $SiO_2$ 2 having a thickness of about 20Å was formed as a native oxide film on the Si substrate 1 because the Si substrate is contacted with water vapor and heated.

Other methods of forming a $Ta_2O_5$ film include a reactive sputtering method in which a metallic target of Ta is sputtered in a mixed gas of argon and oxygen to form $Ta_2O_5$. Where the $Ta_2O_5$ is formed by the reactive sputtering method, a $SiO_2$ film (native oxide layer) having a thickness of about 20Å is formed by a plasma of argon and oxygen.

Subsequently, a $Si_3N_4$ film 4 having a thickness of about 30Å was formed on the $Ta_2O_5$ film 3 according to the well-known CVD method. Thereafter, in order to reduce initial lowering in the dielectric strength of the $Ta_2O_5$ film 3 as the capacitor insulating film, a heat treatment was conducted in a dry oxygen atmosphere at 1,000° C. for 30 minutes to thinly oxidize the surface of the $Si_3N_4$ film 4 as the reaction-preventing film.

Subsequently, a polycrystalline Si film 5 is formed as the upper electrode on the $Si_3N_4$ film 4 to form a capacitor.

In this example, provision of the $Si_3N_4$ film 4 having a thickness of about 30Å as the reaction-preventing film between the $Ta_2O_5$ film 3 as the high dielectric constant capacitor insulating film and the polycrystalline Si film 5 as the upper electrode can prevent diffusion of Si in the polycrystalline Si film 5 into the $Ta_2O_5$ film 3 and, hence, the reaction of Si with the $Ta_2O_5$ film 3 due to a heat treatment in the course of production of a semiconductor device after formation of the capacitor, whereby a lowering in the dielectric strength of the capacitor can be prevented. Further, in this example, formation of the $SiO_2$ film having a thickness of about 30Å as the native oxide layer between the Si substrate 1 and the $Ta_2O_5$ film 3 can prevent diffusion of Si of the Si substrate 1 into the $Ta_2O_5$ film 3 and, hence, the reaction of Si with the $Ta_2O_5$ film 3 due to the above-mentioned heat treatment in the course of production of the semiconductor device, whereby a lowering in the dielectric strength of the capacitor can be prevented.

Figure 2:
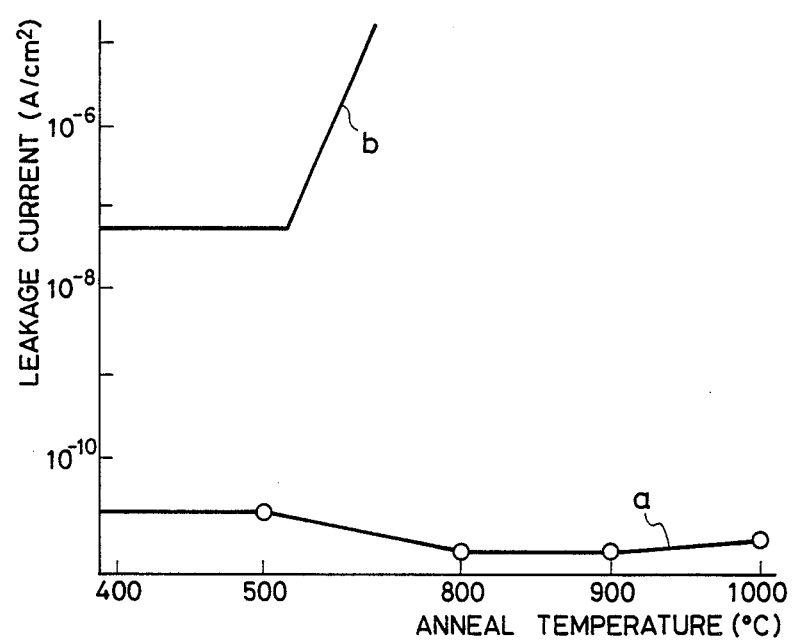

FIG. 2 is a diagram showing a relationship between the temperature of the heat treatment (annealing) after formation of the capacitor of this example and the leakage current in a comparison of the case where the reaction-preventing film was provided according to the present invention with the case where it was not provided. In FIG. 2, line a is concerned with the case of the capacitor having the reaction-preventing film according to the present invention while line b is concerned with the case of the capacitor having no reaction-preventing film. The conditions of the heat treatment involved a temperature range of 500° to 1,000° C. and a heat treatment time of 30 minutes.

As is apparent from the line a in FIG. 2, the capacitor having the reaction-preventing film undergoes no increase in leakage current even when annealing was conducted at 1,000° C., which is a heat treatment temperature, for example, for doping with an impurity in the course of usual production of an LSI. In contrast, in the capacitor having no reaction-preventing film on the $Ta_2O_5$ film, the leakage current drastically increases with elevation of the heat treatment temperature as is apparent from the line b in FIG. 2.

Thus, in this example, provision of the reaction-preventing film can prevent the reaction between the upper electrode containing Si or the like and the capacitor insulating film, whereby a high-capacity capacitor having a high thermal resistance can be realized.

Further, it was found from the results as shown in FIG. 2 that the capacitor of this example had another significant effect. Specifically, even in the range of an annealing temperature of 500° C. or lower, different results were obtained as to the leakage current value depending on the presence or absence of the reaction-preventing film. As is apparent from FIG. 2, even when the annealing temperature is low, the capacitor of this example shows a far lower leakage current due to the presence of the reaction-preventing film just like when the annealing temperature is high, as compared with the capacitor having no reaction-preventing film. In this example, since the insulating film of the capacitor had a triple layer structure of $Si_3N_4/Ta_2O_5/SiO_2$, the leakage current can be drastically decreased. Since the thickness of the $Si_3N_4$ film 4 formed on the $Ta_2O_5$ film was as small as about 30Å and the thickness of the $SiO_2$ film 2 formed on the Si substrate 1 was as small as about 20Å, a decrease in capacity is insignificant.

When a $SiO_2$ film was formed as the reaction-preventing film instead of the $Si_3N_4$ film 4, a decrease in the leakage current was observed as well. Where a $SiO_2$ film was used as an insulating film of a capacitor, said film was formed by, for example, the CVD method, and heat-treated in an atmosphere of ammonia at about 950° C. for 30 min to nitride the surface of the $SiO_2$, whereby a lowering in the initial dielectric strength was prevented.

Besides the $SiO_2$ film and the $Si_3N_4$ film, a phosphosilicate glass film or the like can be used as the reaction-preventing film in the present invention. The thickness of the reaction-preventing film is chosen within a range of 10 to 100Å, preferably 20 to 100Å as described above.

Although $Ta_2O_5$ (tantalum oxide) was used as the material of the high dielectric constant insulating film, the same effects were obtained when a metallic oxide such as niobium oxide ($Nb_2O_5$), titanium oxide ($TiO_2$), zirconium oxide ($Zr_2O_5$), aluminum oxide ($Al_2O_3$), hafnium oxide (HfO), or yttrium oxide ($Y_2O_3$) was used.

The smaller the thickness of the capacitor insulating film, the larger the capacitance. However, it is difficult to form an insulating film of the above-mentioned material having a thickness of less than 20Å without pinholes. When the thickness exceeds 350Å, the subsequent crystal growth becomes notable, leading to a remarkable reduction in the characteristics of the insulating film. Thus, the thickness of the capacitor insulating film is chosen within a range of 20 to 350Å.

Besides the polycrystalline silicon, various silicides such as $WSi_2$, $MoSi_2$, $TaSi_2$ and $TiSi_2$ can be used in the upper electrode. Where a film of a conductive substance not containing silicon, such as W, Mo, Ta, TiN, or Cr, is used in the upper electrode, a reaction similar to the aforementioned formula (1) occurs, whereby the dielectric strength of the capacitor is lowered. When a reaction-preventing film is formed between the capacitor insulating film and the upper electrode, the above-mentioned reaction is prevented. Thus, not only a film of polycrystalline silicon or a silicide but also a film of the above-mentioned conductive substance not containing silicon can be used as the upper electrode.

Although a silicon substrate was used as the lower electrode in the above-mentioned example, needless to say, a film of polycrystalline silicon, one of silicides, and one of various conductive substances as mentioned above can be used as the lower electrode just like the upper electrode.

An oxide film is formed on the lower electrode when the capacitor insulating film is formed, and serves as a reaction-preventing film. Thus, formation of a reaction-preventing film before the formation of the capacitor insulating film is usually unnecessary.

However, it is a matter of course that the formation of a $SiO_2$ film, a $Si_3N_4$ film, or a phosphosilicate glass film as a second reaction-preventing film after the formation of the lower electrode and before the formation of the capacitor insulating film does not present any troubles and provides a further improved reliability.

As discussed above, according to the present invention, provision of a reaction-preventing film as a barrier layer between a high dielectric constant insulating film and an upper electrode can secure the thermal resistance of a capacitor using a high dielectric constant insulating film resistant to a heat treatment of up to about 1,000° C. required in the course of production of a usual LSI. Thus, the present invention can be effectively applied to a device requiring a capacitor having a small area, such as a MOS dynamic memory.

What is claimed is:

1. A semiconductor device having a capacitor, which comprises a lower electrode, a capacitor insulating film formed on said lower electrode and made of a high dielectric constant material, an upper electrode formed on said capacitor insulating film, and a reaction-preventing film interposed between said capacitor insulating film and said upper electrode, said reaction-preventing film having a thickness so as to prevent a reaction between material of said capacitor insulating film and material of said upper electrode, the capacitor insulating film being made of a member selected from the group consisting of $Ta_2O_5$, $Nb_2O_5$, $TiO_2$, $ZrO_2$, $Al_2O_3$, HfO and $Y_2O_3$.

2. A semiconductor device as claimed in claim 1, wherein a silicon dioxide film is interposed between the lower electrode and the capacitor insulating film.

3. A semiconductor device as claimed in claim 2, wherein the lower electrode is a polycrystalline silicon film.

4. A semiconductor device as claimed in claim 1, wherein the lower electrode is a polycrystalline silicon film.

5. A semiconductor device ax claimed in claim 1, wherein said reaction-preventing film is made of a member selected from the group consisting of $SiO_2$, $Si_3N_4$, and phosphosilicate glass.

6. A semiconductor device as claimed in claim 5, wherein the thickness of said reaction-preventing film is 10 to 100 Å.

7. A semiconductor device as claimed in claim 6, wherein the thickness of said reaction-preventing film is 20 to 100Å.

8. A semiconductor device as claimed in claim 1, wherein said upper electrode is made of a member selected from the group consisting of polycrystalline silicon, $WSi_2$, $MoSi_2$, $TaSi_2$, $TiSi_2$, W, Mo, Ta, TiN and Cr.

9. A semiconductor device as claimed in claim 1, wherein said lower electrode comprises a silicon substrate.

10. A semiconductor device as claimed in claim 1, wherein said lower electrode is a film made of a member selected from the group consisting of polycrystalline silicon, $WSi_2$, $MoSi_2$, $TaSi_2$, $TiSi_2$, W, Mo, Ta, TiN and Cr.

11. A semiconductor device as claimed in claim 9 or 10, wherein an oxide film is formed on said lower electrode by oxidation of the surface of said lower electrode.

12. A semiconductor device as claimed in claim 9 or 10, wherein material of the capacitor insulating film can react with material of the lower electrode, and wherein a second reaction-preventing film is formed on said lower electrode, interposed between the lower electrode and the capacitor insulating film.

13. A semiconductor device as claimed in claim 12, wherein said second reaction-preventing film is made of a member selected from the group consisting of $SiO_2$, $Si_3N_4$, and phosphosilicate glass.

14. A semiconductor device as claimed in claim 1, wherein the thickness of said capacitor insulating film is 20 to 350Å.

15. A semiconductor device having a capacitor, which comprises a lower electrode, a capacitor insulating film formed on said lower electrode and made of a high dielectric constant material, an upper electrode formed on said capacitor insulating film, and a reaction-preventing film interposed between said capacitor insulating film and said upper electrode, said reaction-preventing film having a thickness so as to prevent a reaction between material of said capacitor insulating film and material of said upper electrode, wherein said reaction-preventing film is a $SiO_2$ film or a phosphosilicate glass film and wherein a $Si_3N_4$ film is formed on said $SiO_2$ film or said phosphosilicate glass film by nitriding the surface of said $SiO_2$ film or said phosphosilicate glass film.

16. A semiconductor device as claimed in claim 15, wherein a silicon dioxide film is interposed between the lower electrode and the capacitor insulating film.

17. A semiconductor device as claimed in claim 16, wherein the lower electrode is polycrystalline silicone film.

18. A semiconductor device as claimed in claim 15, wherein the lower electrode is a polycrystalline silicon film.

19. A semiconductor device as claimed in claim 15, wherein said upper electrode is made of a member selected from the group consisting of polycrystalline silicon, $WSi_2$, $MoSi_2$, $TaSi_2$, $TiSi_2$, W, Mo, Ta, TiN and Cr.

20. A semiconductor device as claimed in claim 15, wherein said lower electrode comprises a silicon substrate.

21. A semiconductor device as claimed in claim 15, wherein said lower electrode is a film made of a member selected from the group consisting of polycrystalline silicon, $WSi_2$, $MoSi_2$, $TaSi_2$, $TiSi_2$, W, Mo, Ta, TiN and Cr.

22. A semiconductor device as claimed in claim 20 or 21, wherein an oxide film is formed on said lower electrode by oxidation of the surface of said lower electrode.

23. A semiconductor device as claimed in claim 20 or 21, wherein material of the capacitor insulating film can react with material of the lower electrode, and wherein a second reaction-preventing film is formed on said lower electrode, interposed between the lower electrode and the capacitor insulating film.

24. A semiconductor device as claimed in claim 23, wherein said second reaction-preventing film is made of a member selected from the group consisting of $SiO_2$, $Si_3N_4$, and phosphosilicate glass.

25. A semiconductor having a capacitor, which comprises a lower electrode, a capacitor insulating film formed on said lower electrode and made of a high dielectric constant material, an upper electrode formed on said capacitor insulating film, and a reaction-preventing film interposed between said capacitor insulating film and said upper electrode, said reaction-preventing film having a thickness so as to prevent a reaction between material of said capacitor insulating film and material of said upper electrode, wherein said reaction-preventing film is a $Si_3N_4$ film and a $SiO_2$ film is formed on said $Si_3N_4$ film by oxidizing the surface of said $Si_3N_4$ film.

26. A semiconductor device as claimed in claim 25, wherein a silicon dioxide film is interposed between the lower electrode and the capacitor insulating film.

27. A semiconductor device as claimed in claim 26, wherein the lower electrode is a polycrystalline silicon film.

28. A semiconductor device as claimed in claim 25, wherein the lower electrode is a polycrystalline silicon film.

29. A semiconductor device as claimed in claim 25, wherein said upper electrode is made of a member selected from the group consisting of polycrystalline silicon, $WSi_2$, $MoSi_2$, $TaSi_2$, $TiSi_2$, W, Mo, Ta, TiN and Cr.

30. A semiconductor device as claimed in claim 25, wherein said lower electrode comprises a silicon substrate.

31. A semiconductor device as claimed in claim 25, wherein said lower electrode is a film made of a member selected from the group consisting of polycrystalline silicon, $WSi_2$, $MoSi_2$, $TaSi_2$, $TiSi_2$, W, Mo, Ta, TiN and Cr.

32. A semiconductor device as claimed in claim 30 or 31, wherein an oxide film is formed on said lower electrode by oxidation of the surface of said lower electrode.

33. A semiconductor device as claimed in claim 30 or 31, wherein material of the capacitor insulating film can react with material of the lower electrode, and wherein a second reaction-preventing film is formed on said lower electrode, interposed between the lower electrode and the capacitor insulating film.

34. A semiconductor device as claimed in claim 33, wherein said second reaction-preventing film is made of a member selected from the group consisting of $SiO_2$, $Si_3N_4$, and phosphosilicate glass.

35. A semiconductor device having a capacitor, which comprises a lower electrode, a capacitor insulating film formed on said lower electrode and made of a high dielectric constant material, an upper electrode formed on said capacitor insulating film, said capacitor insulating film being made of a material that reacts with material of which the upper electrode is made, selected from the group consisting of $Ta_2O_5$, $Nb_2O_5$, $TiO_2$, $ZrO_2$, $Al_2O_3$, HfO and $Y_2O_3$, and a reaction-preventing film interposed between said capacitor insulating film and said upper electrode, said reaction-preventing film having a thickness so as to prevent a reaction between material of said capacitor insulating film and the material of said upper electrode.

36. A semiconductor device having a capacitor, which comprises a lower electrode, a capacitor, insulating film formed on said lower electrode and made of a high dielectric constant material, an upper electrode formed on said capacitor insulating film, said capacitor insulating film being made of a material that reacts with material of which the upper electrode is made, and a reaction-preventing film interposed between said capacitor insulating film and said upper electrode, said reaction-preventing film being a $SiO_2$ film or a phosphosilicate glass film, with a $Si_3N_4$ film being provided on said $SiO_2$ film or said phosphosilicate glass film by nitriding the surface of said $SiO_2$ film or said phosphosilicate glass film, said reaction-preventing film having a thickness so as to prevent a reaction between material of said capacitor insulating film and the material of said upper electrode.

37. A semiconductor device having a capacitor, which comprises a lower electrode, a capacitor insulating film formed on said lower electrode and made of a high dielectric constant material, an upper electrode formed on said capacitor insulating film, said capacitor insulating film being made of a material that reacts with material of which the upper electrode is made, and a reaction-preventing film interposed between said capacitor insulating film and said upper electrode, said reaction-preventing film being a $Si_3N_4$ film and a $SiO_2$ film provided on said $Si_3N_4$ film by oxidizing the surface of said $Si_3N_4$ film, said reaction-preventing film having a thickness so as to prevent a reaction between material of said capacitor insulating film and the material of said upper electrode.

38. A semiconductor device having a capacitor, which comprises a lower electrode, a capacitor insulating film formed on said lower electrode and made of a high dielectric constant material, an upper electrode formed on said capacitor insulting film, said capacitor insulating film being made of a high dielectric constant metal oxide that reacts with material of which the upper electrode is made, and a reaction-preventing film interposed between said capacitor insulating film and said upper electrode, said reaction-preventing film having a thickness so as to prevent a reaction between material of said capacitor insulating film and the material of said upper electrode.

39. A semiconductor device as claimed in claim 38, wherein said upper electrode is made of a member selected from the group consisting of polycrystalline silicon, $WSi_2$, $MoSi_2$, $TaSi_2$, W, Mo, Ta, TiN and Cr.

* * * * *